(12) United States Patent
Baldwin, Jr. et al.

(10) Patent No.: US 11,778,768 B2
(45) Date of Patent: Oct. 3, 2023

(54) HIGH-SPEED PERFORMANCE ELECTRICAL CONNECTOR FOR MODULAR ELECTRONICS SYSTEMS

(71) Applicant: NATIONAL INSTRUMENTS CORPORATION, Austin, TX (US)

(72) Inventors: Richard G. Baldwin, Jr., Austin, TX (US); Dennis Vance Toth, Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 17/408,312

(22) Filed: Aug. 20, 2021

(65) Prior Publication Data

US 2022/0061181 A1 Feb. 24, 2022

Related U.S. Application Data

(60) Provisional application No. 63/068,789, filed on Aug. 21, 2020.

(51) Int. Cl.
*H05K 7/14* (2006.01)
*G06F 1/18* (2006.01)
*H01R 12/70* (2011.01)

(52) U.S. Cl.
CPC .......... *H05K 7/1424* (2013.01); *G06F 1/183* (2013.01); *H01R 12/7005* (2013.01); *H05K 7/1454* (2013.01); *H05K 7/1488* (2013.01); *H05K 2201/044* (2013.01)

(58) Field of Classification Search
None
See application file for complete search history.

(56) References Cited

U.S. PATENT DOCUMENTS

| 5,793,614 A | * | 8/1998 | Tollbom | H05K 7/1409 361/801 |
| 6,147,872 A | * | 11/2000 | Roy | H05K 7/1409 361/801 |
| 6,198,633 B1 | * | 3/2001 | Lehman | G06F 1/185 361/801 |

(Continued)

*Primary Examiner* — James Wu
*Assistant Examiner* — Christopher L Augustin
(74) *Attorney, Agent, or Firm* — Kowert, Hood, Munyon, Rankin & Goetzel, P.C.; Jeffrey C. Hood

(57) ABSTRACT

A connector gap between a module connector mating surface and the backplane connector of a chassis may be eliminated through a mechanism that forcefully pushes (or pulls) the module towards the backplane and/or forcefully pushes (or pulls) the backplane toward the module. A spring-loaded or resilient element may be used to fasten the module in a way that effectively fills any designed-in and tolerance-induced gap in the connector interface, allowing the connector to fully seat. In addition, a gasket or other compressible member may be included at the connector mating interface. The gap in the connector interface may be reduced by introducing adjustable card cage members that are capable of being set during the assembly or manufacturing process using special alignment fixtures. The gap in the connector interface may also be reduced by introducing a higher tolerance capable manufacturing process, such as machining, to the card cage sub-assembly.

20 Claims, 11 Drawing Sheets

(56) References Cited

U.S. PATENT DOCUMENTS

| | | | |
|---|---|---|---|
| 6,471,310 B2* | 10/2002 | Montagna | G06F 1/185 |
| | | | 361/801 |
| 6,582,241 B1* | 6/2003 | Lutz, Jr. | H01R 12/7005 |
| | | | 439/157 |
| 6,760,220 B2 | 7/2004 | Canter et al. | |
| 6,927,974 B2 | 8/2005 | Robillard et al. | |
| 7,210,586 B2* | 5/2007 | Ice | H05K 7/1404 |
| | | | 361/756 |
| 7,355,850 B2 | 4/2008 | Baldwin, Jr. | |
| 10,070,553 B2 | 9/2018 | Lee et al. | |
| 10,136,540 B2 | 11/2018 | Magnoux | |
| 10,622,761 B1* | 4/2020 | Held | H01R 13/6315 |
| 2006/0067063 A1* | 3/2006 | Stahl | H05K 7/1409 |
| | | | 361/759 |
| 2009/0175007 A1* | 7/2009 | Joist | H05K 7/1407 |
| | | | 361/740 |
| 2014/0308828 A1 | 10/2014 | Ehlen | |

* cited by examiner

HIGH-SPEED PERFORMANCE ELECTRICAL CONNECTOR FOR MODULAR ELECTRONICS SYSTEMS

PRIORITY CLAIM

This application claims benefit of priority to U.S. Provisional Application No. 63/068,789, titled "High-Speed Performance Electrical Connector for Modular Electronics Systems", filed on Aug. 21, 2020, which is hereby incorporated by reference in its entirety as though fully and completely set forth herein.

BACKGROUND OF THE INVENTION

Field of the Invention

This invention relates generally to measurement and data acquisition systems, including high performance high-speed connectors in modular electronics systems.

Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a USB (Universal Serial Bus), a GPM (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT or for influencing the system being controlled. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include Source-Measure Units (SMUs), which may apply a voltage to a DUT and measure the resulting current, or may apply a current to the DUT and measure the resulting voltage. Measurement systems, e.g. DAQ devices as noted above, may also include oscilloscopes and/or other types of signal analyzers, signal generators, function analyzers, etc.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT or to influence the system being controlled.

As mentioned above, a measurement device may be a card or board plugged into one of the I/O slots of the computer system, or a card or board plugged into a chassis, or an external device. Such structures typically include a backplane (or "backplane system"), which refers to a group of electrical connectors in parallel with each other such that each pin of each connector is linked to the same relative pin of all the other connectors, forming a computer bus. Backplanes are thus used as a backbone to connect several printed circuit boards together to make up a complete computer system, and commonly feature a printed circuit board, though wire-wrapped backplanes have also been used in minicomputers and high-reliability applications. There is ongoing research pertaining to connector options, for example backplane connectors options for PCIe Gen4 and/or Gen5 within the PXIe architecture, for example. For signaling beyond ~12GT/s, (where GT/s is an abbreviation of "Giga Transfers per second" in reference to the number of operations transferring data that occur in each second in some given data-transfer channel) using high-speed connectors like a current ZD design (which is one example of a backplane connector system,) any sizeable gap between the mating surfaces of the two connectors results in higher return loss and consequently reduced eye margin (in reference to the quality of a received signal—often impaired by interference, crosstalk, echo, and other noise—which can be viewed as a well-known "data eye" inclusive of a superposition of a number of impaired individual signals with varying frequency components.)

PXI chassis and module dimensions are defined by IEEE and CompactPCI specifications, primarily IEEE 1101.1 & 1101.10 and PICMG 2.0. When a chassis is designed and manufactured according to these specifications, it is very likely that there a sizeable gap exists between the module connector mating surface and the corresponding surface on the backplane connector when the module is fully inserted. This is considered a design feature as a mechanical interference would create stress on connectors, modules, and backplanes, potentially causing damage. It is desirable to minimize or eliminate the connector gaps in modular electronics systems to improve signal performance while maintaining backwards compatibility with older connectors within the current PXI(e) architecture (or more generally, within current bus architectures, e.g. switch-fabric architectures).

Other corresponding issues related to the prior art will become apparent to one skilled in the art after comparing such prior art with the present invention as described herein.

SUMMARY OF THE INVENTION

In various embodiments, many disadvantages associated with present day electrical backplane connectors, may be overcome by effectively filling or reducing any designed-in and tolerance-induced gap in the connector mating interface.

In some embodiments, the gap may be eliminated by introducing a feature, like spring or resilient element, within the module or card cage (enclosure into which printed circuit boards or cards are inserted). Such a feature may effectively fill any designed-in and/or tolerance-induced gap in the connector interface, allowing the connector to fully seat with respect to the connecting module. In some embodiments, the gap may be eliminated by introducing a resilient element, such as a gasket or other compressible member, at the connector mating interface. In some embodiments, the gap in the connector interface may be reduced by introducing adjustable card cage members that are capable of being set during the assembly or manufacturing process using special alignment fixtures. In some embodiments, the gap may be reduced in the connector interface by introducing a higher tolerance capable manufacturing process, such as machining, to the card cage sub-assembly.

Pursuant to the above, a mechanism for connecting a module to a chassis may include a plug to couple the module to the chassis, and may further include a first element that forcefully pushes or pulls the module towards a backplane of the chassis to effectively reduce or eliminate a designed-in and/or tolerance-induced gap between the end of the module connector and the back surface of the plug when the connector is inserted into the plug. Alternately, or in addition, the mechanism may include a second element that forcefully pushes or pulls the backplane towards the chassis to effectively reduce or eliminate the designed-in and/or tolerance-induced gap between the end of the connector and the back surface of the plug when the connector is inserted into the plug. The mechanism may also include a module front panel-to-chassis ground.

In some embodiments, the first element and/or the second element may each include a first spring-loaded fastener at the top end of the chassis and a second spring-loaded fastener at the bottom end of the chassis, and/or a first spring-loaded plunger assembly at the top end of the chassis and a second spring-loaded plunger assembly configured at the bottom end of the chassis. The first spring-loaded fastener and the second spring-loaded fastener may each include a screw which, when tightened, holds the connector into a fully seated position, and the first spring-loaded plunger assembly and the second spring-loaded plunger assembly may each include a plunger which, when engaged, pushes the module into a fully seated position in the plug.

In some embodiments, the mechanism may also include a grounding gasket for each spring-loaded fastener, with the grounding gasket filling up any remaining gap between a front panel of the module and the chassis. The mechanism may also include a first ejector handle that includes a member to provide a positive mating pressure on the module when the connector is inserted into the plug, in addition to acting to unseat the module from the plug when the first ejector handle is in the eject position. The mechanism may include a second ejector handle similar to the first ejector handle, with the first ejector handle situated at the top end of the chassis and the second ejector handle situated at the bottom end of the chassis.

A chassis may include the above detailed mechanism for each plug of the chassis on a per-module basis for securely connecting multiple modules to the chassis, each module connecting to a corresponding plug of the chassis.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
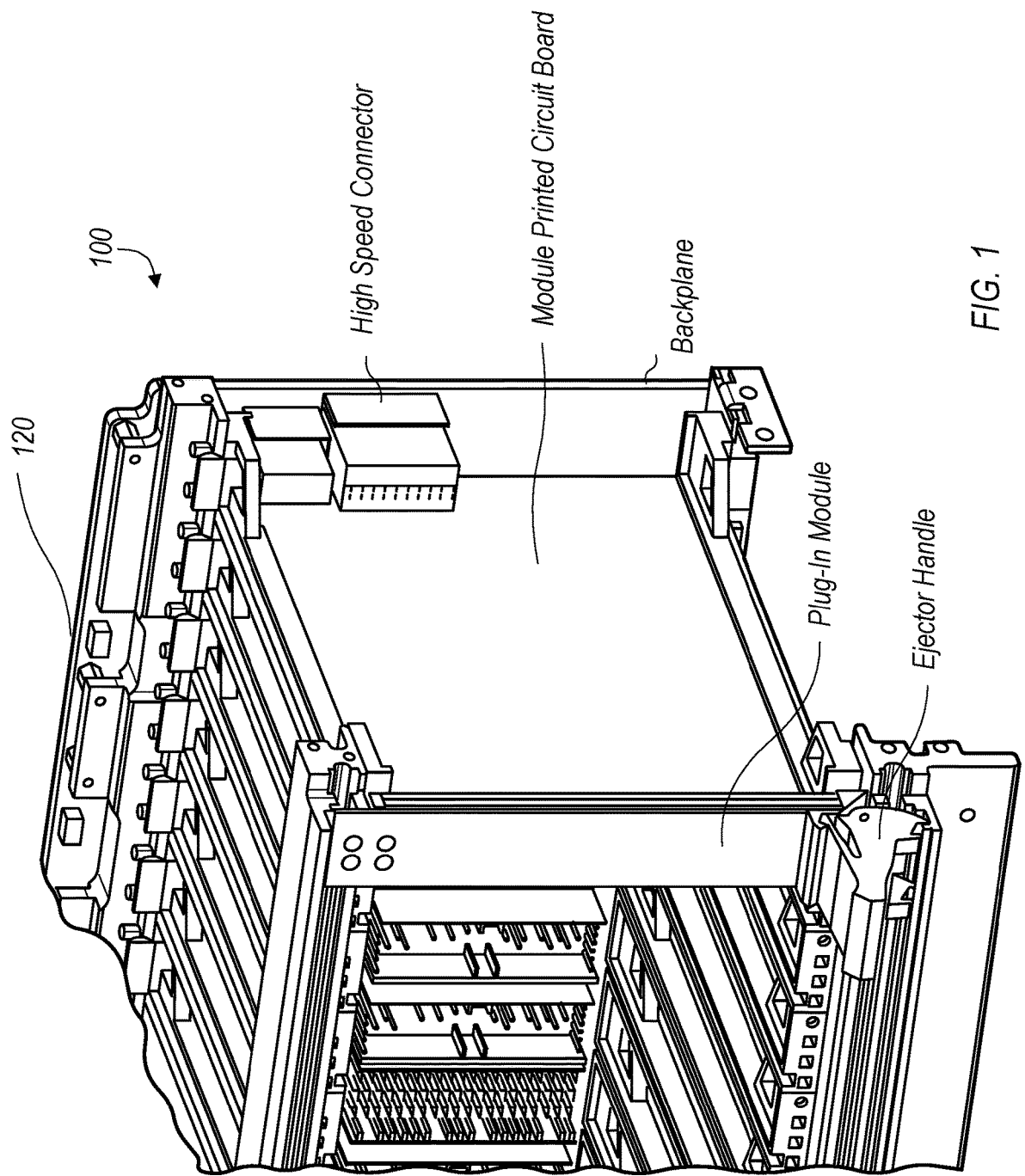
FIG. 1 shows a diagram illustrating a general view of an instrumentation module inserted into backplane, indicating the key elements.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated above. In other words, applications discussed in the present description are exemplary only, and the present invention may be used in any of various types of systems that uses a chassis or where high-speed connectors such as backplane connectors are used. Thus, the system and method of the present invention is operable to be used in any of various types of applications, including the control of other types of devices such as multimedia devices, video devices, audio devices, telephony devices, Internet devices, etc.

Figure 2:
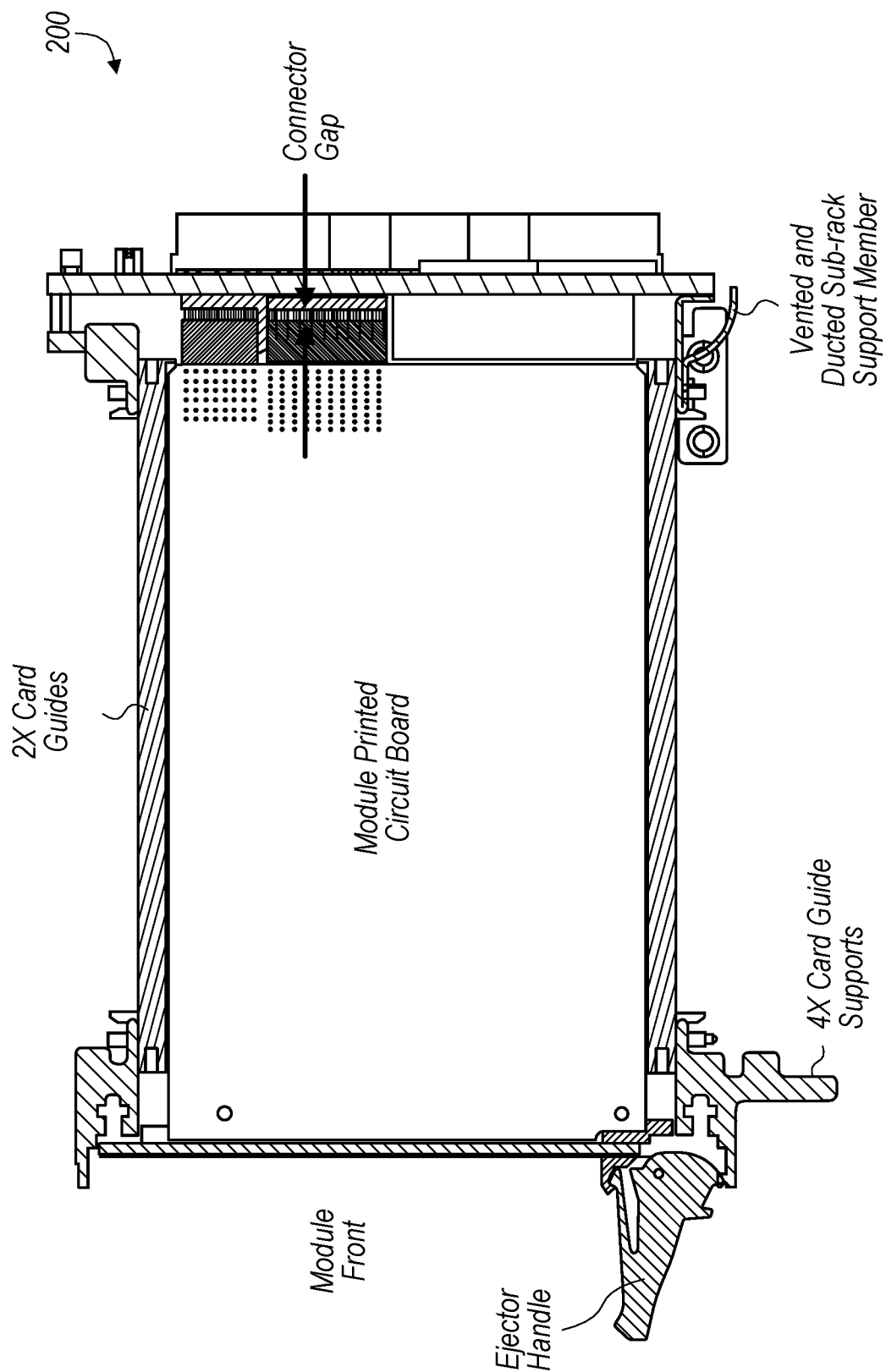
FIG. 2 shows a diagram illustrating an instrumentation module cross-section showing a sample connector gap and other module elements.

FIG. 1 and FIG. 2 show the various aspects of current chassis architecture including the high-speed connector gap problem. As shown in chassis system 100, a plug-in module plugs into a chassis 120 via a high-speed connector to the backplane of the chassis 120. An ejector handle provides fastening and release for the plug-in module. As seen in the cross-section 200 of FIG. 2, corresponding to exemplary system 100 of FIG. 1, there is a gap between the end of the module connector and the back of the plug within the chassis.

Eliminating Connector Gaps

In some embodiments, a connector gap may be eliminated by employing various solutions that include but are not limited to 1) an element that forcefully pushes (or pulls) the module towards the backplane and/or 2) an element that forcefully pushes (or pulls) the backplane toward the module. Some solutions may be more suitable to a modular architecture, e.g., like PXI, than others. Specifically, if a backplane were spring loaded (or configured with a spring) and one module were installed in that backplane, there is a good chance there might be a force imbalance (torque) applied to the backplane causing the backplane to no longer be perpendicular to the module, thus creating a binding risk. Consequently, implementations at the module or slot level may be preferable, as they may be most likely to prevent binding with the card cage system. In some aspects, for example for PXI and similar architectures, it may also be advantageous to maintain module front panel-to-chassis ground.

FIGS. 3 to 6 illustrate some possible design solutions according to a first option to potentially solve the connector gap problem. Additional concepts not shown and relating to the first option are possible and are contemplated.

First Option: Sample Design A

Figure 3:
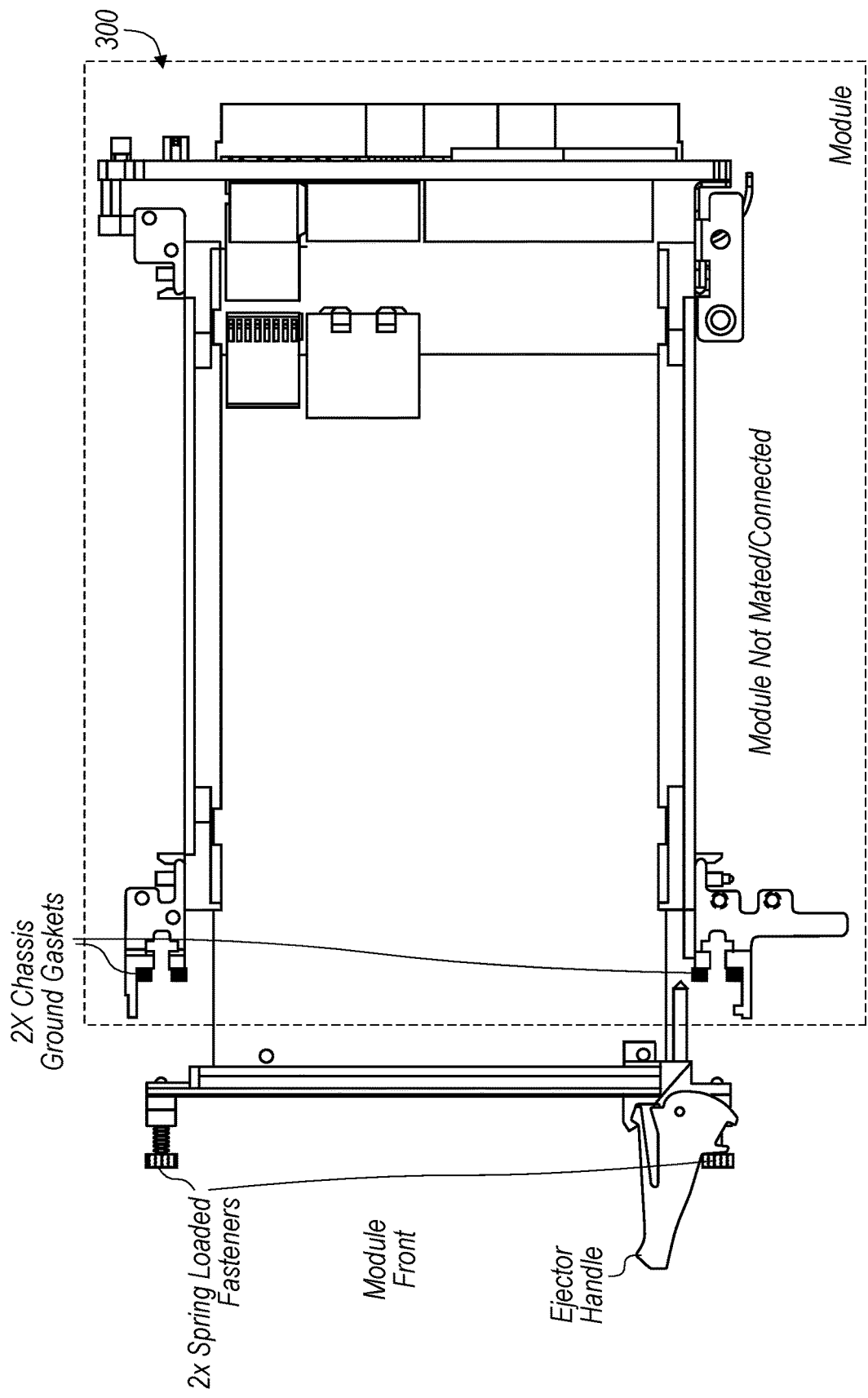
FIG. 3 shows a diagram illustrating an exemplary connector design with spring-loaded fasteners, with the module not fully mated/connected, according to some embodiments.
Figure 4:
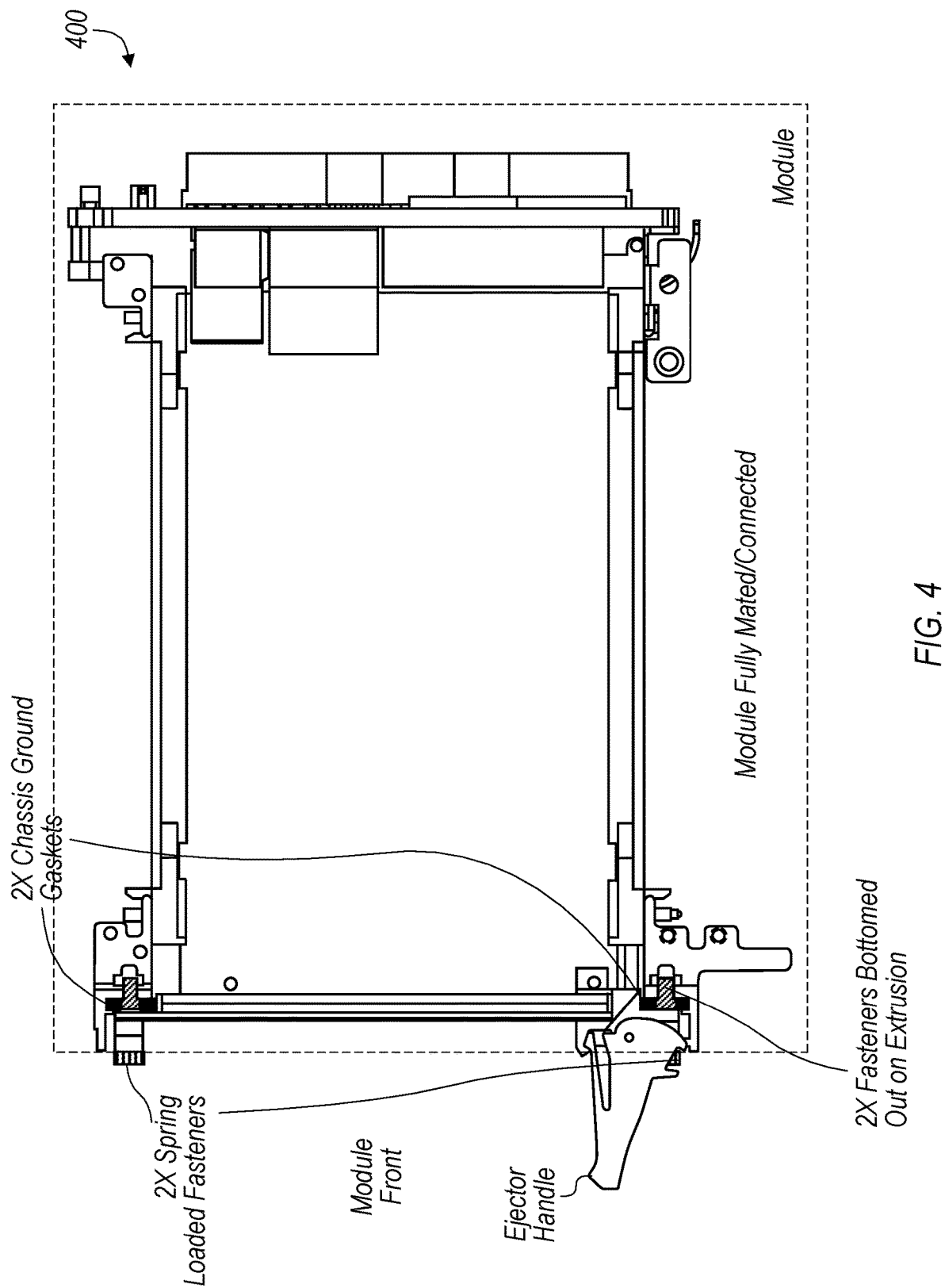
FIG. 4 shows a diagram illustrating an exemplary connector design with spring-loaded fasteners, with the module fully mated/connected, according to some embodiments.

This option introduces a shoulder screw/fastener and spring at each of the two existing module mounting fastener locations as illustrated in FIGS. 3 and 4. As shown in FIG. 3, two (2) spring loaded fasteners may be configured on the chassis, one on top and one on the bottom (by the ejector handle). FIG. 3 shows the unmated module to easily identify the spring-loaded fasteners. Once the module is inserted, the screws are tightened down, with the shoulder screw bottoming out on the card cage extrusions as shown in FIG. 4. The springs provide the necessary force for the module to hold the module connector into a fully seated potion. The connection may further include a grounding gasket for each spring-loaded fastener (or screw) as shown in FIG. 3 and FIG. 4 (shaded in black) which takes up any remaining gap between the front panel and the chassis to maintain proper chassis ground and electromagnetic compatibility (EMC) gasketing for that module. It should be noted that current PXI modules do not bottom out the high-speed connector before their front panel contacts the chassis, otherwise damage could occur when tightening the screws. There are multiple design options for the spring-loaded fastener as well as the chassis ground gasket. The concept illustrated in FIGS. 3-4 highlights the basic principle of a generic solution.

First Option: Sample Design B

Due to the high connector insertion forces that may be involved, especially on modules with multiple connectors, the ejector handle may need to be modified to include a resilient member and/or a new mechanism that provides a positive mating pressure on the module. Current ejectors, like those on PXI, are used for insertion but do not provide a mating pressure after the module has been inserted. A variant of the first option may therefore include a second ejector handle at the top of the module in addition to the one already located at the bottom. While not shown in FIGS. 3 and 4, an ejector handle, similar to the one illustrated, may be included atop the module. Design concepts for modified ejectors/injectors are possible and are contemplated.

First Option: Sample Design C

Figure 5:
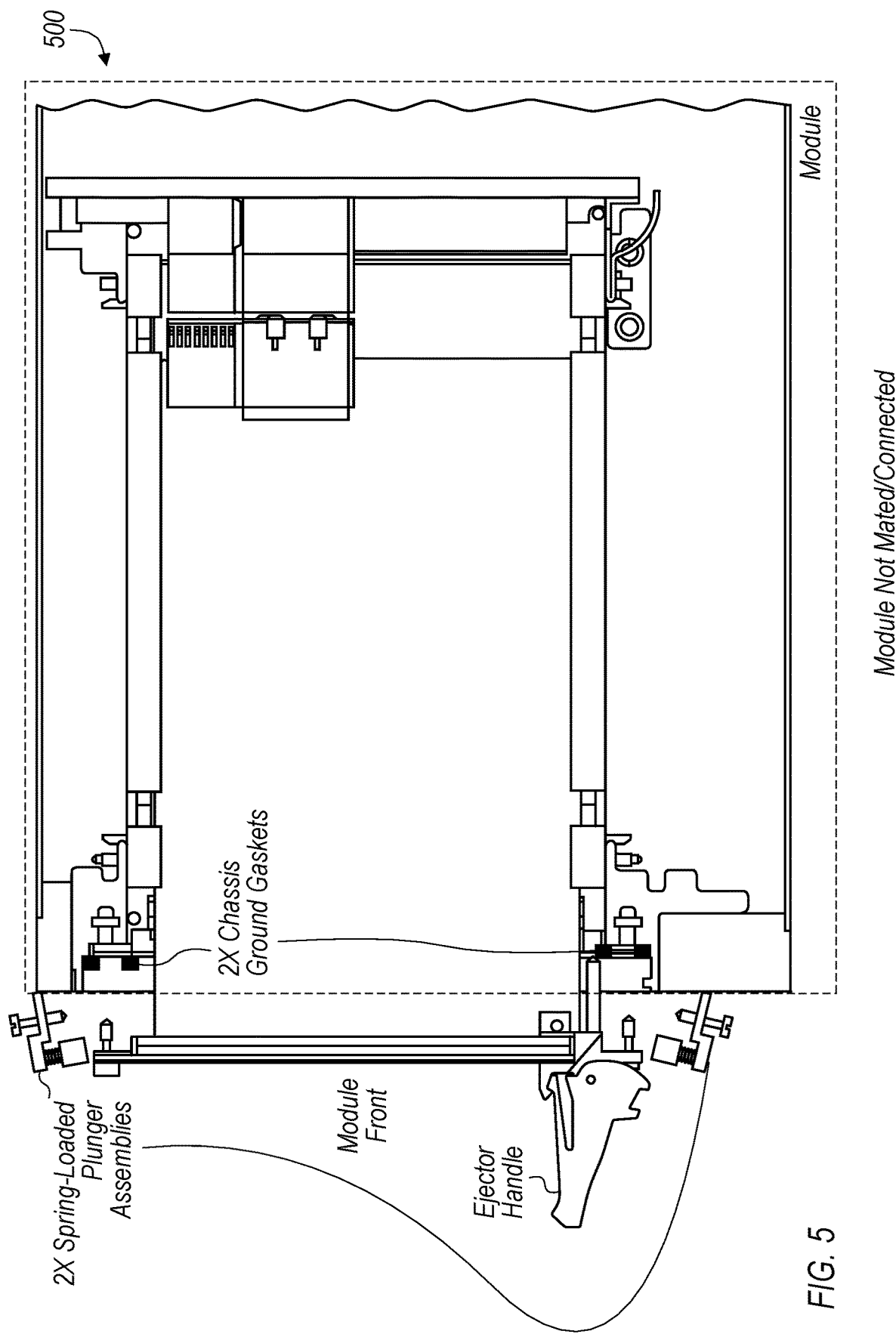
FIG. 5 shows a diagram illustrating an exemplary connector design with a spring loaded plunger, with the module not fully mated/connected, according to some embodiments.
Figure 6:
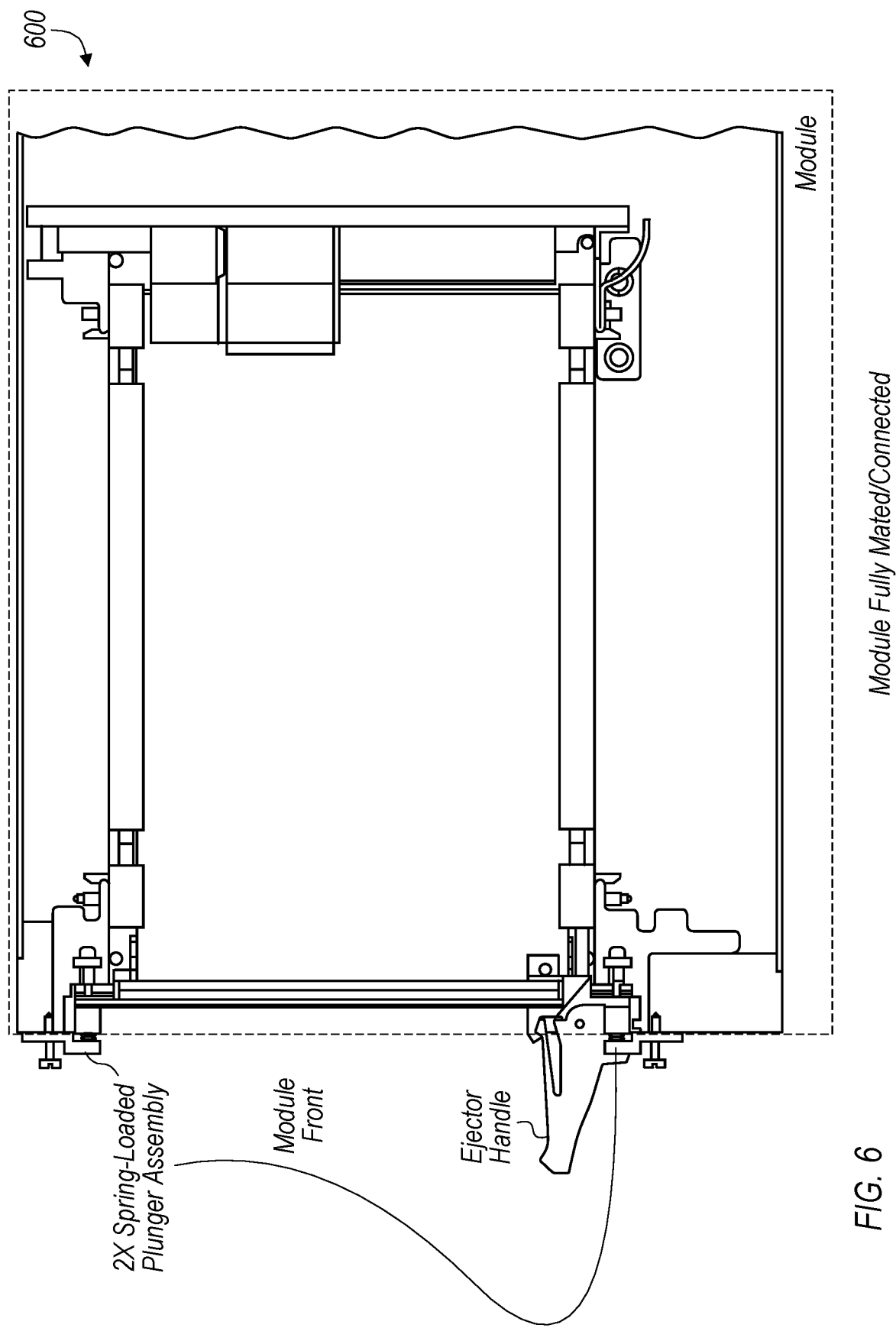
FIG. 6 shows a diagram illustrating an exemplary connector design with a spring loaded plunger, with the module fully mated, according to some embodiments.

Another variant of the first option may introduce an external spring-loaded "plunger" that effectively pushes the module into the fully seated position, as illustrated in FIGS. 5 and 6. As shown in FIG. 5, two (2) spring loaded plunger assemblies may be configured on the chassis, one on top and one on the bottom (by the ejector handle). FIG. 5 shows the unmated module to easily identify the spring-loaded plunger assemblies. The plunger mechanism may push on the front of the module at the top and/or bottom face of the front panel or ejector handle. The plunger mechanism is then tightened down to the chassis to secure the module, as shown in FIG. 6. In this solution, each module is independently secured by an individual "plunger" mechanism, allowing each module to fully seat without binding or torqueing the backplane connector. The plunger assembly may be a single plunger assembly installed for each module or may be an array of plungers in a single assembly that independently adjust to each module front panel. A grounding gasket may again be included to take up or fill any remaining gap between the front panel and the chassis to maintain proper chassis ground for that module.

The example in FIGS. 5 and 6 shows the spring-loaded plunger mechanism attached to the chassis via a hinge support and tightened down with a screw. However, the spring-loaded plunger mechanism may alternatively be a loose member or may be attached to the chassis in a variety of different ways. In addition, the spring-loaded plunger mechanism may be tightened by other means, such as a toggle latch, snap, etc.

Figure 7:
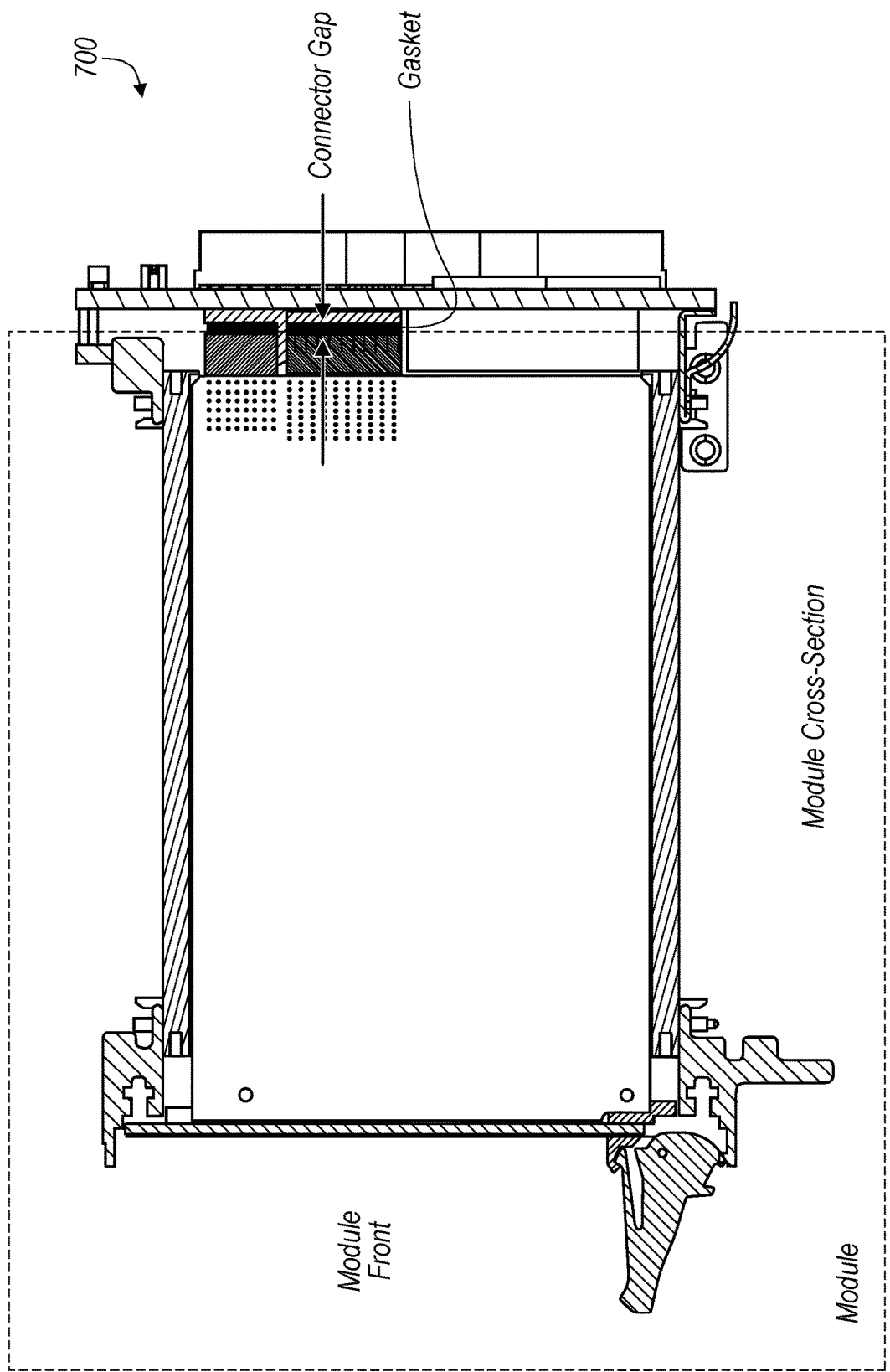
FIG. 7 shows a diagram illustrating an exemplary connector design with a connector gasket, according to some embodiments.

Current ejectors, like those on PXI, are used for insertion but do not provide a mating pressure after inserting the module. Another variation of the first option may be to modify the ejector handle to provide a "landing pad" for the spring-loaded plunger to "push" the module on the bottom.
Second Option A second solution may include but may not be limited to introducing a gasket or other compressible gap filling element to the module-to-backplane connector interface. The gasketing material may effectively reduce the signal performance degradation caused by the air gap within the connector interface. This compressible material may be sized to either completely fill the connector air gap or partially fill the air gap depending on signal performance acceptance criteria. One example of this solution is illustrated in FIG. 7, with the connector gap filled with a gasket material to reduce or eliminate air within the connector.
Third Option A third solution may include but may not be limited to introducing adjustable backplane mounting elements, such as slotted or oversized mounting holes, along with precision located alignment features integrated into components within the card cage assembly or alignment fixtures used to locate the backplane mounting rail during the assembly process. The integrated alignment features may include semi-shears, lances, or formed features added to the card cage side panels, precision alignment pins inserted or otherwise attached to the card cage side panels, and/or alignment brackets attached to the card cage side panels. These alignment features may come with a special fixture when installed or assembled to the side panels, which may be executed through special manufacturing processes, such as hard tooling, or may involve additional processing to the alignment surfaces, such as machining in order to obtain the desired positional tolerance.

Due to module-to-module variations in size due to component tolerances, this option may not eliminate the module-to-backplane connector mating gap but it may significantly reduce the gap to acceptable levels for signal performance requirements. This solution introduces an additional challenge of possibly having to adjust other currently fixed elements of the card cage with the backplane location. Thus, the card guides that align the modules within the card cage may merit special consideration. Current card guides are rigidly mounted and span the card cage from front to rear. A new card guide that is either front-to-rear adjustable, "split" into two card guide elements (a front and rear), or mounted into slots or onto an adjustable or flexible element within the card cage may be considered.

Figure 8:
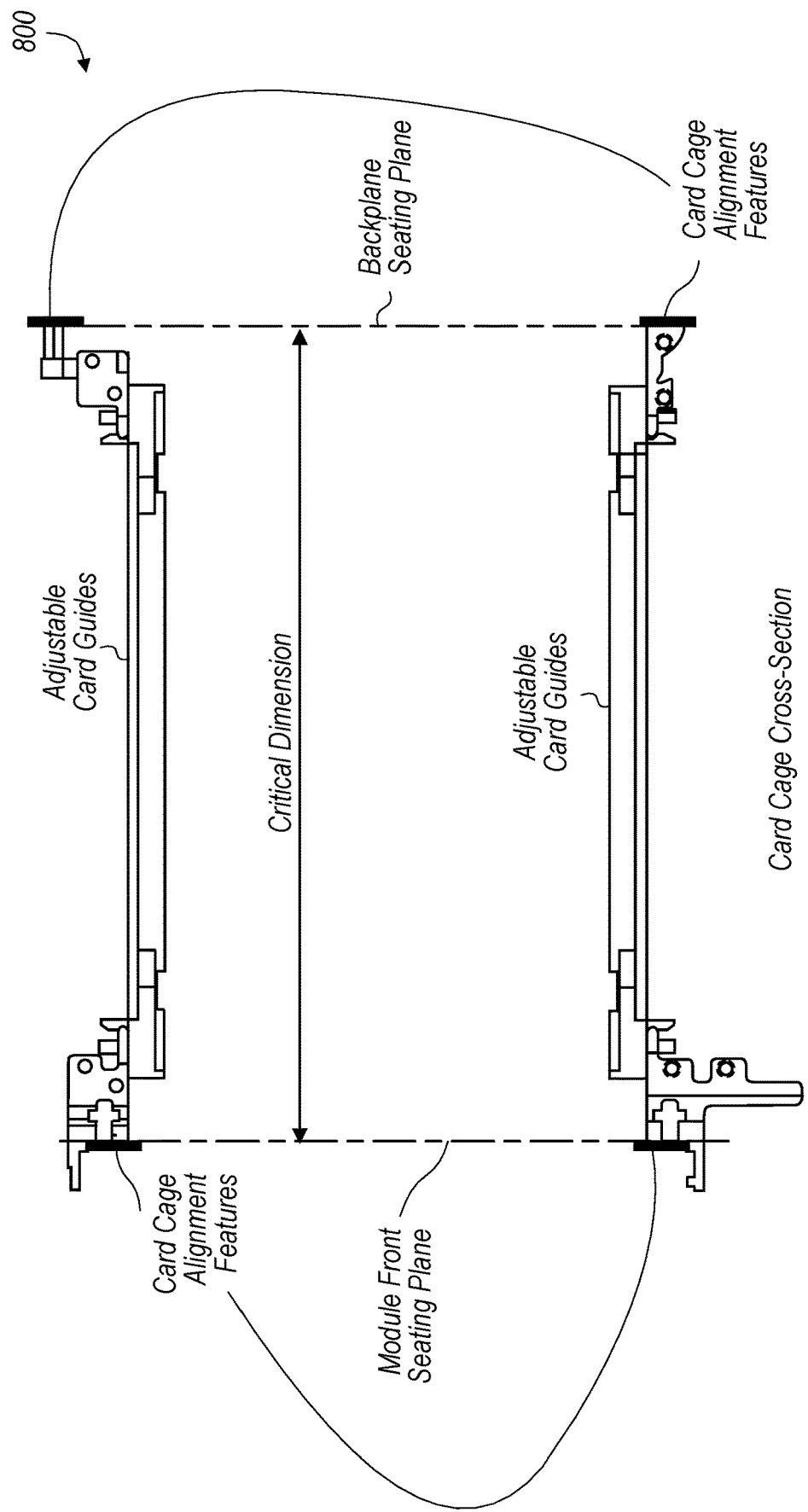
FIG. 8 shows a diagram illustrating an exemplary connector design with precision alignment features or fixtures, according to some embodiments.

FIG. 8 illustrates one example of a solution according to the third option, showing where the card cage alignment features may be implemented. FIG. 8 shows card guides that may be adjusted as opposed to rigidly spanning the card cage from front to rear. The card cage alignment features are used for adjusting the card guide positioning from the module front end as well as from the module back end. The critical dimension refers to the distance from the front seating place to backplane seating plane.
Fourth Option A fourth solution may include but may not be limited to introducing a high-tolerance process, such as machining or grinding, to the manufacturing of the card cage assembly or sub-assemblies that are part of the card cage. Although the processes, such as machining, may not on their own be unique, applying them to the card cage of modular electronics systems to eliminate the tolerance stack-up of the various components included in the card cage may be considered unique. This may provide a benefit of obviating the need for the adjustable card guides illustrated in FIG. 8.

Figure 9:
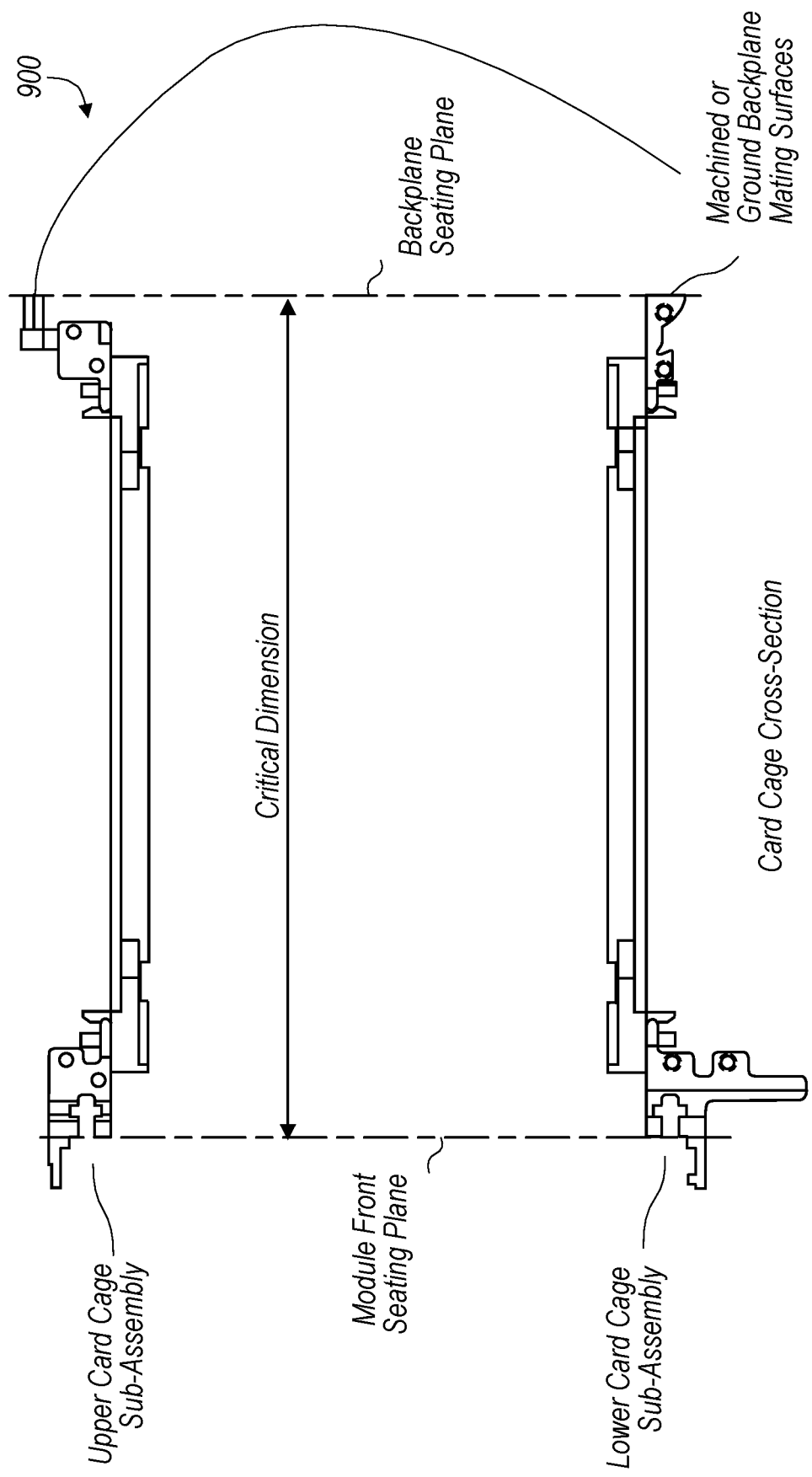
FIG. 9 shows a diagram illustrating an exemplary connector design with machined card cage assembly or sub-assemblies, according to some embodiments.

Similar to the third option, the fourth option may not completely eliminate the module-to-backplane connector mating gap but it may significantly reduce the gap to levels acceptable for the signal performance requirements. FIG. 9 illustrates one example of a solution according to the fourth option, showing where the machined or ground backplane mating surfaces may be situated.

Exemplary System Use

Figure 10:
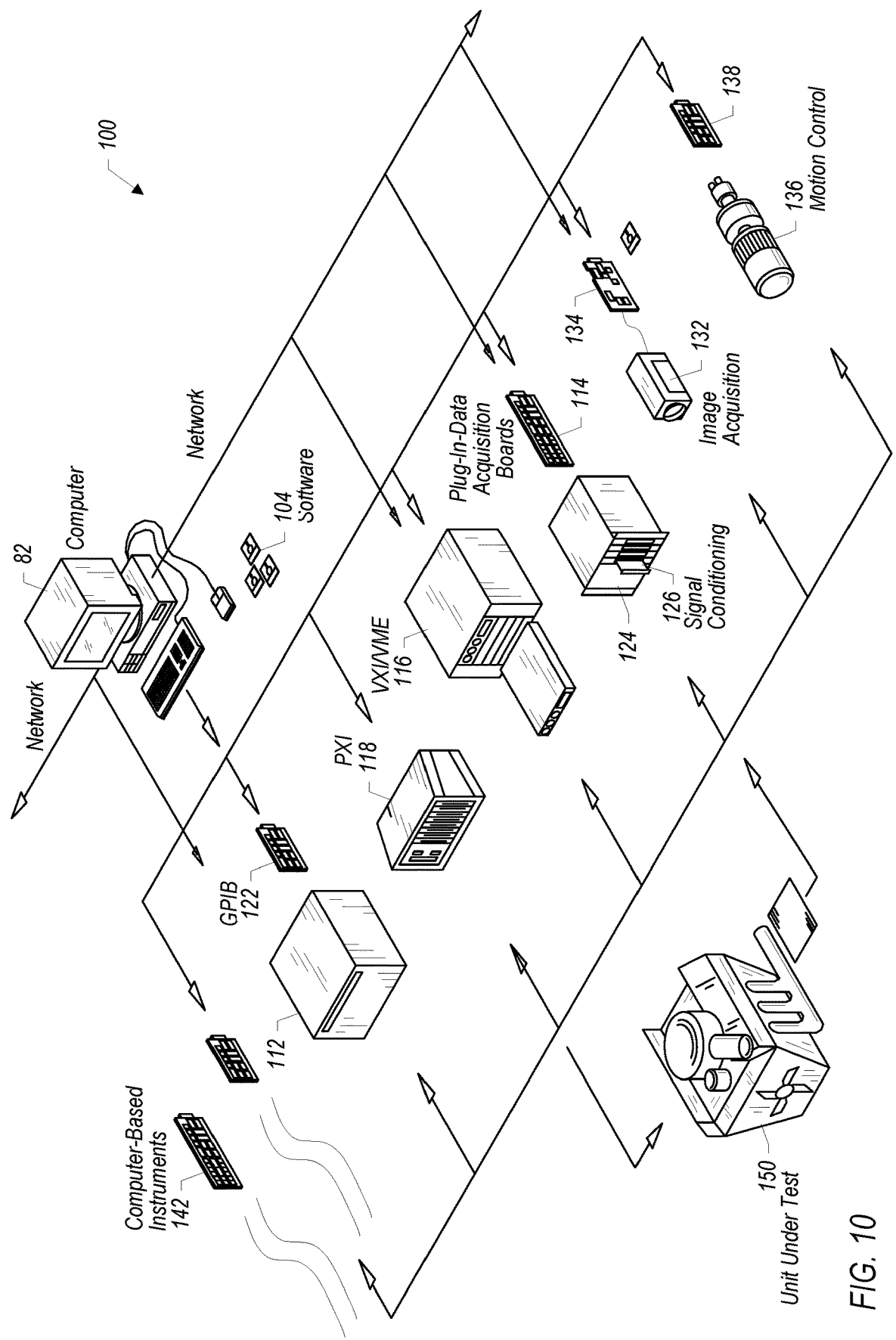
FIG. 10 shows an exemplary instrumentation control system with instruments networked together according to some embodiments.

FIG. 10 illustrates an exemplary instrumentation control system 100 which may be configured according to embodiments of the present invention. System 100 comprises a host computer 82 which may couple to one or more instruments configured to perform a variety of functions using a modular probe, implemented according to various embodiments. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 11:
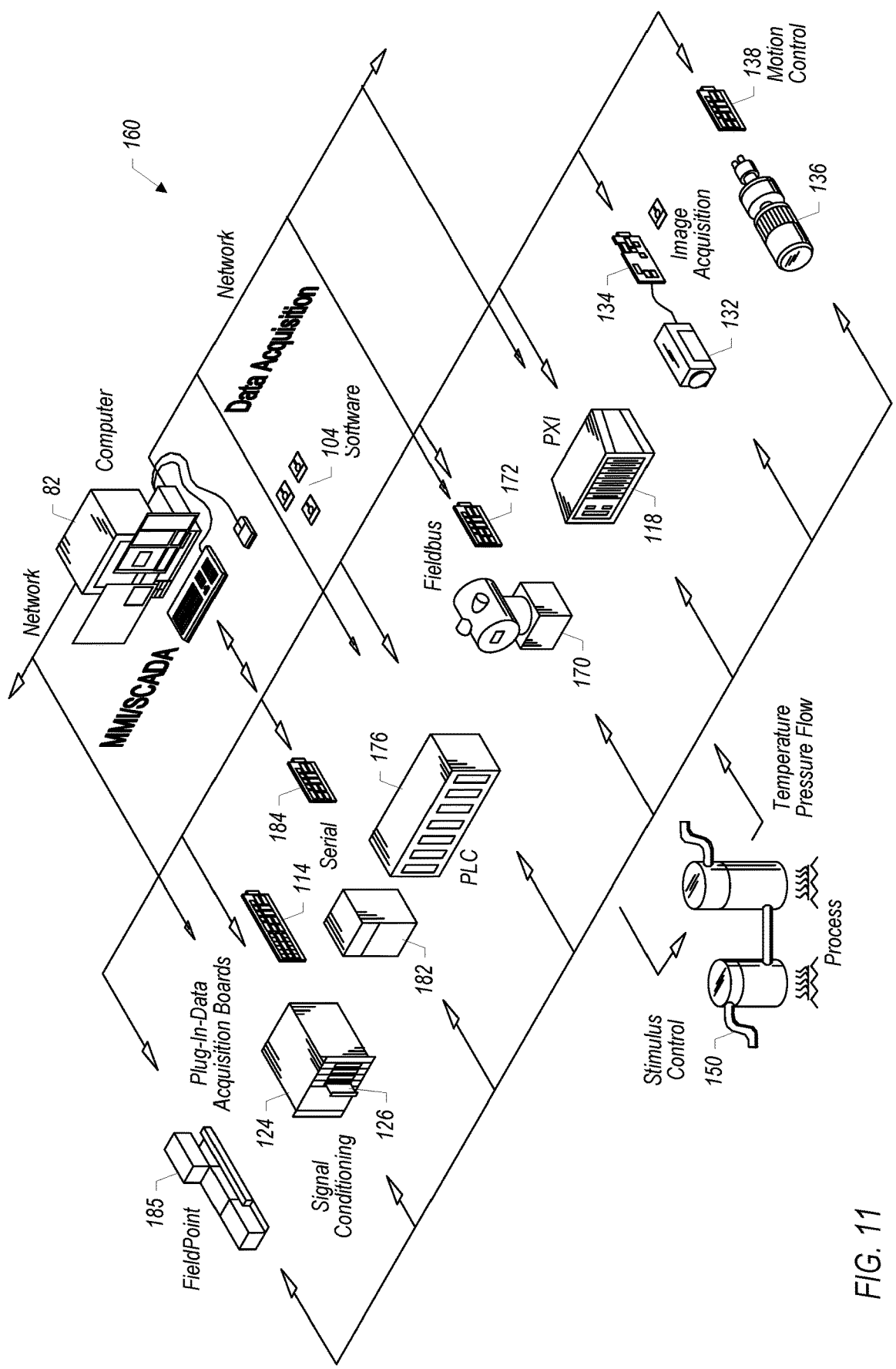
FIG. 11 shows an exemplary industrial automation system with instruments networked together according to some embodiments.

FIG. 11 illustrates an exemplary industrial automation system 160 that may be configured according to embodiments of the present invention. Industrial automation system 160 may be similar to instrumentation or test and measurement system 100 shown in FIG. 1. Elements that are similar or identical to elements in FIG. 1 have the same reference numerals for convenience. System 160 may comprise a computer 82 which may couple to one or more devices and/or instruments configured to use a modular probe as disclosed herein, according to various embodiments. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection, which may facilitate running a high-level synchronization protocol between the computer system and the coupled instruments/devices.

In some embodiments, any one or more of the instrument modules may connect to any one or more of the chassis or card cage of different units (e.g. 112, 118, 116, and 126) using improved connectors as described above. Generally, various embodiments disclosed herein facilitate an instrument module, for example part(s) of an instrument or instruments in an automated test system, to be connected to a chassis and/or card cage more securely to improve high-speed connectivity performance by reducing and/or eliminating the gap between the module connector mating surface and the corresponding surface on the backplane connector of the chassis/card cage.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A mechanism for connecting a module to a chassis, the mechanism comprising:
   a plug configured to couple the module to the chassis;
   wherein the plug comprises a compressible gap filling material configured to fill an air gap between an end of a connector inserted into the plug and a back surface of the plug to meet signal performance acceptance criteria; and
   an element configured to move the module towards a backplane of the chassis to effectively reduce or eliminate a designed-in and/or tolerance-induced gap between the end of the connector of the module and the back surface of the plug when the connector is inserted into the plug,
   wherein the element comprises a first spring-loaded plunger assembly configured at a top end of the chassis and a second spring-loaded plunger assembly configured at a bottom end of the chassis.

2. The mechanism of claim 1, wherein the mechanism further comprises a module front panel-to-chassis ground.

3. The mechanism of claim 1,
   wherein the first spring-loaded plunger assembly and the second spring-loaded plunger assembly each include a plunger which, when engaged, pushes the module into a fully seated position in the plug.

4. The mechanism of claim 1, wherein the mechanism further comprises a grounding gasket for each spring-loaded plunger assembly, wherein the grounding gasket takes up any remaining gap between a front panel of the module and the chassis.

5. The mechanism of claim 1, wherein the mechanism further comprises an ejector handle that includes a member configured to provide a positive mating pressure on the module when the connector is inserted into the plug;
   wherein the ejector handle is configured to unseat the module from the plug when the ejector handle is in an eject position.

6. The mechanism of claim 5, wherein the mechanism further comprises a second ejector handle that includes a member configured to provide a positive mating pressure on the module when the connector is inserted into the plug, wherein the ejector handle is configured at the top end of the chassis and the second ejector handle is configured at the bottom end of the chassis.

7. A chassis comprising:
   one or more plugs, each plug configured to couple a respective module to the chassis;
   wherein at least one of the one or more plugs comprises a compressible gap filling material configured to fill an air gap between an end of a connector inserted into the plug and a back surface of the at least one plug to meet signal performance acceptance criteria; and
   a respective mechanism for connecting each respective module to the chassis via a corresponding plug of the one or more plugs,
   each respective mechanism comprising:
   an element configured to move the respective module towards a backplane of the chassis to effectively reduce or eliminate a designed-in and/or tolerance-induced gap between an end of a connector of the respective module and a back surface of the corresponding plug when the connector is inserted into the corresponding plug,
   wherein the element comprises a first spring-loaded plunger assembly configured at a top end of the chassis and a second spring-loaded plunger assembly configured at a bottom end of the chassis.

8. The chassis of claim 7, wherein each respective mechanism further comprises a respective module front panel-to-chassis ground.

9. The chassis of claim 7,
   wherein the first spring-loaded plunger assembly and the second spring-loaded plunger assembly each include a plunger which, when engaged, pushes the respective module into a fully seated position in the corresponding plug.

10. The chassis of claim 7, wherein each respective mechanism further comprises a grounding gasket for each spring-loaded plunger assembly, wherein the grounding gasket takes up any remaining gap between a front panel of the respective module and the chassis.

11. The chassis of claim 7, wherein each respective mechanism further comprises an ejector handle that includes a member configured to provide a positive mating pressure on the respective module when the connector is inserted into the corresponding plug;
   wherein the ejector handle is configured to unseat the module from the corresponding plug when the ejector handle is in an eject position.

12. The chassis of claim 11, wherein each respective mechanism further comprises a second ejector handle that includes a member configured to provide a positive mating pressure on the module when the connector is inserted into the corresponding plug, wherein the ejector handle is configured at the top end of the chassis and the second ejector handle is configured at the bottom end of the chassis.

13. A mechanism for connecting a module to a chassis, the mechanism comprising:
- a plug configured to couple the module to the chassis and comprising gap filling material configured to fill an air gap between an end of a connector inserted into the plug and a back surface of the plug to meet signal performance acceptance criteria; and
- one of:
  - a first element configured to move the module towards a backplane of the chassis to effectively reduce or eliminate a designed-in and/or tolerance-induced gap between the end of the connector of the module and the back surface of the plug when the connector is inserted into the plug; or
  - a second element configured to move the backplane towards the chassis to effectively reduce or eliminate the designed-in and/or tolerance-induced gap between the end of the connector and the back surface of the plug when the connector is inserted into the plug.

14. The mechanism of claim 13, wherein the mechanism further comprises a module front panel-to-chassis ground.

15. The mechanism of claim 13, wherein the first element includes a first spring-loaded plunger assembly configured at a top end of the chassis and a second spring-loaded plunger assembly configured at a bottom end of the chassis.

16. The mechanism of claim 15,
wherein the first spring-loaded plunger assembly and the second spring-loaded plunger assembly each include a plunger which, when engaged, pushes the module into a fully seated position in the plug.

17. The mechanism of claim 15, wherein the mechanism further comprises a grounding gasket for at least one of:
- the spring-loaded plunger assembly; or
- the second spring-loaded plunger assembly;
- wherein the grounding gasket takes up any remaining gap between a front panel of the module and the chassis.

18. The mechanism of claim 13, wherein the mechanism further comprises an ejector handle that includes a member configured to provide a positive mating pressure on the module when the connector is inserted into the plug;
wherein the ejector handle is configured to unseat the module from the plug when the ejector handle is in an eject position.

19. The mechanism of claim 18, wherein the mechanism further comprises a second ejector handle that includes a member configured to provide a positive mating pressure on the module when the connector is inserted into the plug, wherein the ejector handle is configured at a top end of the chassis and the second ejector handle is configured at a bottom end of the chassis.

20. The mechanism of claim 13, wherein the second element includes a first spring-loaded fastener configured at a top end of the chassis and a second spring-loaded fastener configured at a bottom end of the chassis.

* * * * *